United States Patent [19]

Satoh et al.

[11] Patent Number: 5,560,241

[45] Date of Patent: Oct. 1, 1996

[54] SYNTHETIC SINGLE CRYSTAL DIAMOND FOR WIRE DRAWING DIES

[75] Inventors: Shuichi Satoh; Kazuwo Tsuji; Akito Yoshida; Nobuo Urakawa, all of Hyogo, Japan

[73] Assignee: Sumitomo Electric Industries, Ltd., Japan

[21] Appl. No.: 484,258

[22] Filed: Jun. 7, 1995

Related U.S. Application Data

[62] Division of Ser. No. 247,601, May 23, 1994, abandoned.

[30] Foreign Application Priority Data

Apr. 6, 1989 [JP] Japan .................. 1-088517
Oct. 25, 1989 [JP] Japan .................. 1-277393

[51] Int. Cl.$^6$ ...................................... B21C 3/02
[52] U.S. Cl. ................................ 72/467; 423/446
[58] Field of Search ...................... 72/467; 423/446

[56] References Cited

U.S. PATENT DOCUMENTS

| | | | |
|---|---|---|---|
| 4,122,636 | 10/1978 | Roy | 423/446 |
| 4,181,505 | 1/1980 | De Vries | 423/446 |
| 4,412,980 | 11/1983 | Tsuji | 72/467 |
| 4,505,746 | 3/1985 | Nakai | 72/467 |
| 4,617,181 | 10/1986 | Yazu | 423/446 |
| 4,935,303 | 6/1990 | Ikoma | 428/408 |
| 4,950,625 | 8/1990 | Nakashima | 423/446 |
| 4,980,021 | 12/1990 | Kitamura | 427/38 |
| 5,127,983 | 7/1992 | Imai | 423/446 |

OTHER PUBLICATIONS

Sumitomo Electric Carbide, Inc. —Diamond Group, "Price List for CD Sumicrystal Wire Drawing Die Blanks", dated Oct. 17, 1988.

*Primary Examiner*—Daniel C. Crane
*Attorney, Agent, or Firm*—Pennie & Edmonds

[57] ABSTRACT

A synthetic single crystal diamond for wire drawing die; the process of manufacturing it and a wire drawing die to utilize it are disclosed. At least one plane of the diamond for wire drawing die is a cleavage plane of (111) faces, and the drawing hole of wire drawing die lies vertical to the cleavage plane. The diamond for the wire drawing die is produced by providing a synthetic single crystal having 20–400 ppm nitrogen of Ib type diamond. A groove is made on the diamond surface parallel to (111) faces employing energy beams such as a laser beam, an ion beam and an electron beam. A wedge is struck into the groove to cleave the diamond, and a plate is obtained. Furthermore, the plate is divided into polyhedrons, employing either an energy beam or a blade. The cleavage plane of the polyhedron is almost parallel to the (111) faces of crystal, therefore the cleavage plane is used as the standard plane to build the drawing hole.

5 Claims, 2 Drawing Sheets

5,560,241

SYNTHETIC SINGLE CRYSTAL DIAMOND FOR WIRE DRAWING DIES

This is a division of application Ser. No. 08.247,601 filed May 23, 1994, now abandoned.

BACKGROUND ART

Diamond is a material having the greatest hardness and highest modulus of elasticity of all known materials. Furthermore, extremely pure diamond has additionally the highest thermal conductivity and the highest transmittance in the infrared spectrum. Thus, diamond is a material for which there are no comparable substitutes.

There are two general methods for synthesizing diamond using high temperature and high pressure. In one method, carbon material which is to be converted to diamond is mixed or brought into contact with a solvent metal such as iron, cobalt or nickel. Though the use of a stable high pressure and temperature, the carbon is converted into diamond under the action of the solvent metal. According to such a method, the solvent metal penetrates into the carbon material, whereby the carbon diffuses through the solvent metal, which is in the form of a thin film, to form a diamond. According to this method, diamond is spontaneously nucleated, and rapidly grows until it reaches a certain size. Considerable quantities of fine diamond powder have been synthesized by this method and applied to, e.g. abrasives. However, large diamond crystals of high quality cannot be synthesized by the aforementioned method.

On the other hand, a method of synthesizing large diamond crystals of good quality is disclosed in U.S. Pat. No. 3,297,407 issued Jan. 10, 1967 to R. H. Wentorf, Jr. Furthermore, U.S. Pat. No. 4,632,817 issued Dec. 30, 1986 to Yazu, provides a method for synthesizing a number of large diamond crystals of high quality simultaneously from a plurality of seed crystals. This method is generally called a temperature gradient method.

The present invention relates to using a diamond synthesized by the temperature gradient method.

Most diamond crystal dies are made of a natural diamond, whose (110) or (111) faces are polished. In addition, at least one face perpendicular to said faces is polished for purposes of observation and holing. After these preparations, a wire drawing hole, which is perpendicular to the (110) or (111) faces, is formed by a laser beam, electric discharge or ultrasonic grinding, while observing through the perpendicular polished face. Synthetic diamond crystals have been marketed and various attempts to use them for wire drawing have been carried out.

However, the tool life displayed by the prior art diamond dies varies over a wide range, causing them to be unreliable. Especially, the tool life of wire drawing dies made of natural single crystal diamonds can vary widely for the following reasons.

First, natural diamond crystal wire drawing dies have several faults. For example, it is said that a die having a wire drawing hole perpendicular to the (110) face, has generally the highest wear resistance and the longest life, as shown in Junkatsu (Lubrication), vol. 112, No. 11, 1967.

Second, it is difficult to judge precisely where the (110) face is because natural diamonds have been rounded, and have a variety of shapes, depending upon their degree of dissolution. As a result, it requires considerable skill to determine the (110) faces of a natural diamond being used as a wire drawing die. Therefore, most of the wire drawing holes are actually oriented in an unintended direction, making the tool life of the wire drawing die short.

Third, natural diamonds often have a soft portion and hard portion on one single crystal. As a result, the wire drawing hole partially wears during drawing, causing the wire drawing hole to deform into anything from a complete circle to a distorted circle. Such deformation also causes a shortened tool life.

Recently, a high quality synthetic diamond has been obtained by the temperature gradient method and is on the market. In spite of the many attempts to use the synthetic diamond for a wire drawing die, a high quality wire drawing die has not been obtained yet. The reasons for such unavailability are the following:

First, a synthesized or slightly polished idiomorphic diamond is generally used for the wire drawing die. In order to hold that diamond in a tool holder, a hexahedron diamond is usually employed. This diamond is mainly covered with (100) faces, with the wire drawing holes perpendicular to the (100) faces. However, a drawing hole of such direction has inferior wear resistance and a short tool life.

Second, some of the synthetic diamonds don't have a uniform concentration of nitrogen. This causes partial wear of the drawing hole.

Third, when the diamond is held in the tool holder using the surfaces of grown diamond or polished surfaces, a large stress is required to hold the diamond in place, because the friction coefficient between the diamond surfaces and holder is very low. As a result, the wire drawing die often cracks during drawing.

There are two well known methods for dividing a diamond: cutting and cleaving. In the former method, there are two ways to cut a diamond, one of which is represented by the following technique. A cutting blade, in which diamond particles are embedded, rotates at high speed, presses forward on the diamond and performs the cutting. The other technique involves thermal cutting, using a laser beam, for example.

In the cleaving method, a diamond is grooved by another diamond or a cutting blade and then a knife-shaped wedge is struck in the groove to cleave the diamond. This method is discussed on pages 411–412 of the Kesshokogaku Handbook. The cleaving method is thought to be the best method for dividing a diamond economically because it takes advantage of diamond's propensity to be easily cleaved parallel to the (111) faces. Moreover, the method does not cause a width loss (e.g., equal to the cutting blade), especially when compared to the cutting method. Similarly, it does not require a great deal of time to divide a diamond by this method.

However, the cleaving method is only used by commercial diamond cutters to divide large diamonds for jewelry and ornamental applications. This method is not used in industrial fields because: 1) it requires a high level of skill; 2) the possibility of destroying a high priced diamond is great; and 3) the probability of forming an uneven dividing plane is high. These limitations are discussed in Diamond (Sanyo Shuppan Bouekiu Ltd.), pages 216–218 and "Ceramics" 11 (1976) No. 6 page 520. In addition, it is impossible to divide a diamond to get several, thin and uniform plates which are indispensable for making heat sinks and wire drawing dies.

Based on the present inventors' research, the demands of cleaving by the prior art techniques have been clarified. Specifically, the angle between the groove and the cleavage plane (which forms the (111) faces) cannot be greater than 0.5° in order to obtain an even face. However, it is impossible to groove with such accuracy using another diamond or a cutting blade because a diamond is hard enough that it only permits accuracy within 0.5". Also, the alignment of the groove has to be within 0.1 mm to achieve such cleavage.

However, it is very difficult to groove with such accuracy using the prior art techniques.

SUMMARY OF THE INVENTION

The object of the present invention is to provide a diamond for a wire drawing die which is made of a synthetic single crystal diamond.

Another object of the present invention is to provide a high quality wire drawing die which is made of a synthetic single crystal Ib type diamond containing nitrogen between 20–400 ppm, and comprising at least two (111) faces which have been formed by a cleavage plane and a drawing hole, wherein the angle between the center line of the wire drawing hole and the (111) faces is between 87°–93°, using the cleavage plane as a standard plane.

Another object of the present invention is to provide a method to produce the diamond for a wire drawing die.

Another object of the present invention is to provide an improved process for cleavage.

The disclosed process for manufacturing a diamond for a wire drawing die involves making a groove in a single crystal diamond which is parallel to the (111) faces and made by an energy beam selected from a group consisting of: an electron beam, an ion beam and a laser beam. A wedge is then struck into the groove to divide the single crystal diamond. This process can be applied to a synthetic diamond and a natural diamond.

DETAILED DESCRIPTION OF THE INVENTION

Figure 1:
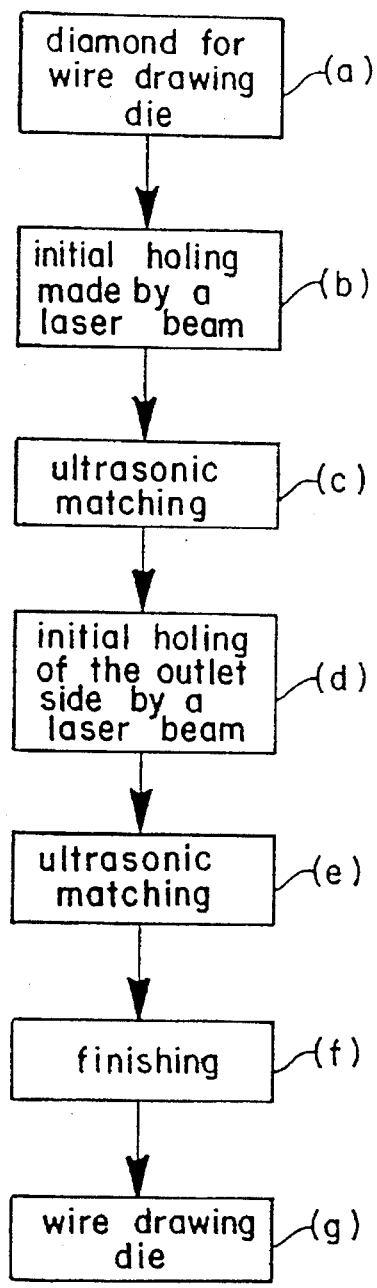
FIG. 1 is a schematic diagram of the process for making the wire drawing die.

This invention relates to a Ib type synthetic single crystal diamond which contains nitrogen between 20–400 ppm and is synthesized by the temperature gradient method. Generally, the nitrogen in the Ib type synthetic single crystal diamond is isolated and distributed. There is a tendency in the Ib type synthetic single crystal diamond for there to be less wear during drawing when there is a higher concentration of nitrogen present. However, when the concentration of nitrogen exceeds 400 ppm, the wear will increase. On the other hand, when the concentration of nitrogen is below 20 ppm, the diamond will only partially wear. These were the relationships (between the concentration of nitrogen and wear) which the inventors found. This invention provides an excellent synthetic diamond for a wire drawing die which shows little wear and which wears uniformly, provided the concentration of nitrogen is between 20 to 400 ppm. Therefore, when the concentration of the nitrogen is out of this range, the wire drawing hole wears unevenly because of the difference in the concentration of nitrogen. When the concentration is outside the preferred range, then the wire drawing hole can be transformed to an irregular shape which is useless for wire drawing. In addition, the wire drawing hole can become enlarged rapidly, causing the die to have a short tool life.

This invention provides a wire drawing die whose drawing direction is perpendicular to the <111> direction and whose hole is built precisely perpendicular to the cleaved (111) faces, using a cleavage plane (in which the (111) faces lie) as a standard plane to minimize the discrepancy from the <111> direction. The inventors have found that the wear resistance of a synthetic single crystal diamond is not so dependent upon the face index as a natural diamond is. Concerning the synthetic single crystal diamond, the wear associated with drawing through a (100) face is great, whereas the wear associated with drawing through the (111) and (110) faces, is less than the wear associated with drawing through a (100) face and nearly the same with respect to each other. Generally, the wear resistance of a natural diamond strongly depends on the drawing direction, and the wear associated with drawing through a (111) face is less than with a (110) face.

It has been found that the wear resistance of the wire drawing hole depends strongly on the discrepancy of the angle between the center line of the drawing hole and the <111> direction. In order to minimize this discrepancy, it has been found to be quite useful that, as the (111) faces should be parallel to the <111> direction, the cleavage plane for the (111) faces can be used as the standard plane for making the wire drawing hole made precisely perpendicular to the cleavage plane.

A diamond which is synthesized by the temperature gradient method is mostly idiomorphic. Therefore, it is precise and easy to discriminate the plane index, and also it is easy to cleave the (111) faces for a desired size idiomorphic single crystal diamond. In addition, it has been found that the faces formed by cutting along the cleavage plane are smooth and even. On the other hand, natural diamonds have been generally rounded, and have a variety of shapes depending upon their dissolution. As a result, it requires considerable skill to determine the proper orientation of a crystal which can serve as a wire drawing die. In many cases, the cleavage planes of natural diamonds have cleavage bandings, which consist of many large steps and spiral steps. Furthermore, other (111) faces which have different directions can arise.

Figure 3:
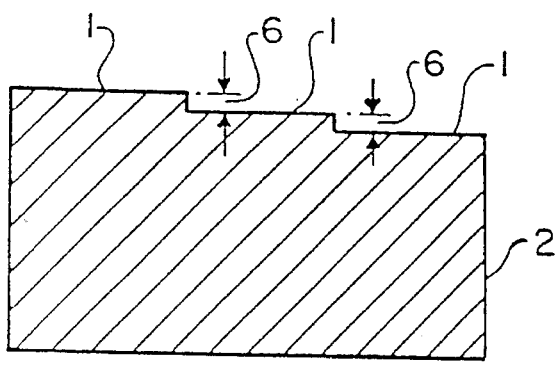
FIG. 3 is a cross-sectional view of the cleavage plane.

In order to make the wire drawing hole perpendicular to the (111) faces, the surface roughness of the standard cleavage plane (111) plays an important role and should be at most 100 μm. As depicted in FIG. 3, the surface roughness is equal to the height (6) between successive steps on the face cleaved by cleavage plane 1. A cut plane 2, using a laser beam, is shown in FIG. 3. To estimate the cleavage plane, the height and the number of steps are important factors to consider. The cleaved face should preferably have at most 3 steps of 1 mm lengths, wherein the height between each step is 30–100 μm.

When the steps number more than 4 and measure more than 1 mm in length, it is impossible to define precisely the <111> direction; therefore, it is difficult to make the drawing hole exactly perpendicular to the <111> direction.

In order to hold the drawing die tightly to the tool holder, at least one side is made rough by cutting thermally, for example, by using a laser beam, to increase the coefficient of friction.

As for the surface of the synthetic diamond, it is smoother than the surface of natural diamond, and much stress is required to hold the wire drawing die to the tool holder when holding on the rough surfaces. When holding on a polished surface, a large stress is also necessary. Such large stress causes cracking of the die during drawing.

This invention provides a solution to lower the compressive stress, because at least one side is a rough surface formed by an energy beam, such as a laser beam, an ion beam or an electron beam. The preferable surface roughness is between 5 to 100 μm. When the surface roughness is less than 5 μm, a large compressive stress is necessary to hold the die to the tool holder, due to a small friction coefficient. On the other hand, when the surface roughness is more than 100 μm, a stress concentration occurs on the uneven surface and this causes the initiation of cracking.

This invention is also directed to a wire drawing die having an angle of 90°±3° between the center line of the wire drawing hole and the <111> direction of the diamond. The discrepancy of the angle from 90° is one of the most important factors for controlling wear resistance during drawing. The larger the discrepancy, the less the wear resistance of the wire drawing hole.

This invention also provides an improved wire drawing die which has the characteristics of a long tool life, wherein the angle between the cleavage plane of the (111) faces and the center line of the drawing hole is in the narrow range between 89° to 91°. The cleavage of a single diamond is necessary for this invention.

A (111) plane of a synthetic single crystal rough diamond may be used as the standard plane for making the wire drawing hole to lower the discrepancy in the angle; however, this method is inferior in that the shape of the wire drawing die becomes close to the shape of a single diamond and is not easily controlled. In addition, a single diamond having a large (111) plane area must be selected for this technique to be successful.

This invention also provides a method to produce a wire drawing die having a long tool life. This invention involves the next two processes:

The first is that a surface of a single crystal diamond is grooved parallel to the (111) faces by a method selected from the following group: an ion beam; an electron beam; and a laser beam. Using an X-Y table having a moving apparatus, the (111) faces of the single crystal diamond are adjusted parallel to the X or Y axis of the table and also parallel to the energy beam and then the single crystal diamond is easily grooved. This process is preferred as an effective means for preparing the diamond for the next step in the cleavage process, since it permits one, without considerable skill in the prior art, to cleave reliably and precisely. After grooving on the surface of the single crystal diamond, a sharp plate, such as a wedge or a knife made of metal or ceramic, is set into the groove and the sharp plate is forced into the groove parallel to the (111) faces. Then, the single crystal diamond is divided completely. Hammering, pressing, or the stress of thermal expansion can be used to force the sharp plate into the groove.

Generally, the length of the wedge is longer than that of the groove. However, there is no limit to the length of the wedge. When using a knife as a wedge, the length of the knife should be shorter than the groove. Furthermore, a needle can occasionally be used as a wedge. This improved process is easier, more reliable and more precise in dividing a diamond than the prior art methods which are based on using a laser beam (which was said to be the most reliable and precise method to divide a single crystal diamond). Since the groove becomes V shaped, when the energy beam is used, good results are obtained. These processes can be applied to a synthetic single crystal diamond and a natural single crystal diamond.

Figure 4A:
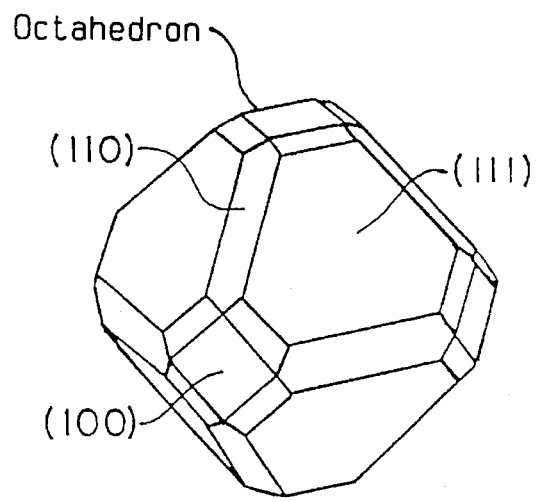
FIG. 4(a) is an octa-hexahedron.
Figure 4B:
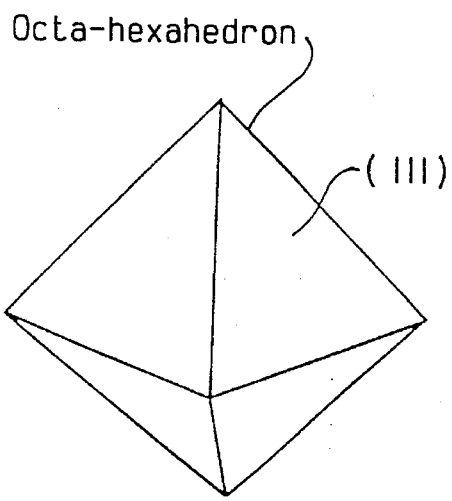
FIG. 4(b) is an octahedron and FIG. 4 (c) is a hexahedron.
Figure 4C:
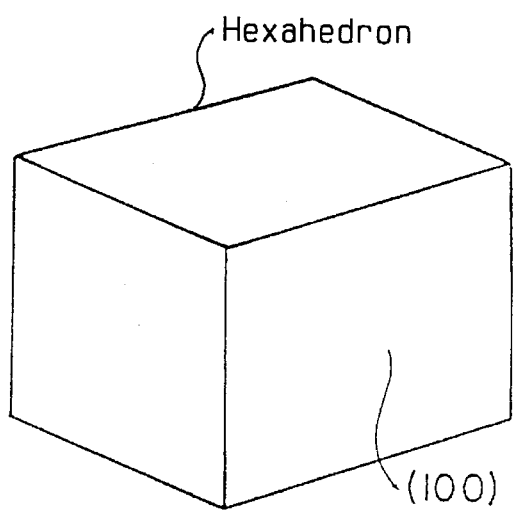
FIG. 4 shows typical single crystal diamonds. In particular.

A large and good quality synthetic single crystal diamond is more preferable than a natural single crystal diamond, because it can be divided more reliably, more easily and more precisely than a single crystal diamond. As aforementioned, most of natural single crystal diamonds are dissolved in the earth, and their surfaces are curved or uneven. Therefore, it is difficult to discriminate the (111) faces (the faces which are indispensable for cleavage of single crystal diamond) from their external appearance. There is a method however to discriminate a plane index using X-ray. But this method takes much time and many steps. Thus, this method is not efficient or economical. On the other hand, the synthetic single crystal diamond is generally a polyhedron surrounded by (111) faces and (100) faces, as shown in FIG. 4. Therefore, it is easy to discriminate the (111) faces from an inspection of the diamond's external appearance, and it is also preferable to use the synthetic single crystal diamond for this invention. When the single crystal diamond is set on the X-Y table to groove, it is easy to align the single crystal diamond within 0.1° between the (111) faces and the grooving direction. Thus, the grown plane (111) of the diamond is only fixed to the standard plane, which is parallel to the moving direction on the X-Y table.

In addition, a synthetic single crystal diamond which is larger than 1.5 mm in diameter, i.e., larger than 1/30carat size, and of high quality, is superior to a synthetic crystal diamond which is generally called an abrasive in the market and which is less than 1 mm in diameter. The abrasive is too small to handle and the quality is not sufficient for use in wire drawing dies.

The processes described herein insure that the alignment of the groove is within 0.1 mm and that the discrepancy of the angle between the (111) faces of the diamond and the cleavage plane used to form those faces is within 0.5°. Therefore, the cleavage plane can be used as the standard plane to form the wire drawing hole.

When the wire drawing hold becomes enlarged from normal wear and erosion, the hole can be re-shaped for drawing larger wire.

DESCRIPTION OF PREFERRED EMBODIMENTS

EXAMPLE 1

Five Ib type single crystal diamonds, which contained 10–500 ppm of nitrogen and were of a 0.4–0.6 carat size, were synthesized under a pressure of 5.5 GPa and at a temperature of between 1300° C. to 1400° C., employing the temperature gradient method and various solvent metals. These synthetic single crystal diamonds had cleaved (111) faces, and a 1.5 mm thick plate was obtained. The plates were cut into a hexahedron of 2 mm×2 mm×1.5 mm using a laser beam. Furthermore, a side cut with the laser beam was polished and a diamond for wire drawing die was obtained. The polished surface was the (110) face. The height of the step on the cleaved faces was 60 μm. The surface roughness of the sides cut by the laser beam were 40 μm.

Figure 2:
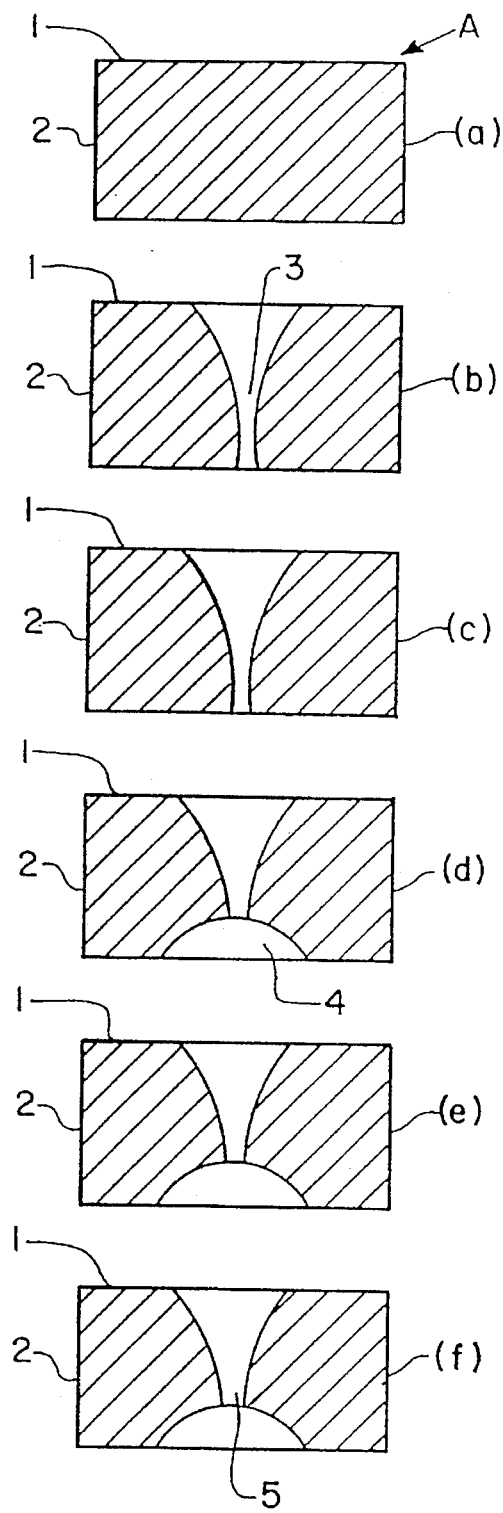
FIG. 2 is a cross-sectional view, showing a wire drawing hole in each step of FIG. 1.

Each diamond was worked into a wire drawing die, following the process of FIG. 1. FIG. 2 shows the shape of the wire drawing hole corresponding to FIG. 1. A diamond for wire drawing die A in FIG. 2(a) (1 is a cleaved face, 2 is a side cut by the laser) had an initial hole 3 made by the laser beam, as shown in FIG. 2(b). Next, the surface of the initial hole was polished smooth by ultrasonic machining, as shown in FIG. 2(c). The opposite side of diamond A had an initial hole 4 made by the laser beam, as shown in FIG. 2(d).

Next, the surface of the initial hole was also polished smooth by ultrasonic machining, as shown in FIG. 2(e). Finally, a wire was passed through the wire drawing hole 5 to provide a finish and the wire drawing die was obtained, as shown in FIG. 2(f). The diameter of the wire drawing hole was 40 μm, as obtained by measuring the diameter of the wire. Each wire drawing die was set in a holder and used for copper drawing.

The results are shown below in Table 1.

adsorption coefficient at 1130 $cm^{-1}$. The height of the steps on the cleavage plane was between 50 to 60 μm. The surface roughness of the side cut by the laser beam was between 25 to 30 μm. The surface roughness of the polished side was 0.1 μm. After measuring the angle between the center line of the wire drawing hole and the cleavage plane or polished plane (using an X-ray apparatus for measuring the direction of crystal), the wire drawing dies were employed for copper wire drawing. The results are shown below in Table 2. All of

TABLE 1

| Experiment No. | 1 Comparison | 2 Example | 3 Example | 4 Example | 5 Comparison |
| --- | --- | --- | --- | --- | --- |
| Synthesis Temperature (°C.) | 1350 | 1300 | 1350 | 1390 | 1400 |
| Solvent metal (°C.) | Fe-5Ni | FE-20Ni | FE-50Ni | Fe-80Ni | Ni |
| Concentration of nitrogen (ppm) | 10 | 20 | 100 | 400 | 500 |
| Weight of copper wire passing through the die (kg) | 50 | 250 | 310 | 290 | 60 |
| Cause of tool life decrease | Partial wear (*) | Diameter too large() | Diameter too large() | Diameter too large(**) | Partial wear (*) |

(Caution)*Partial Wear: wire drawing hole had partial wear and the hole was distorted
**Diameter too large: the wire drawing hole showed uniform wear and the hole was enlarged Table 1 shows that the wire drawing dies which contain nitrogen between 20 to 400 ppm have excellent properties.

the wire drawing holes became enlarged, and their tool life shortened.

EXAMPLE 2

Six single crystal diamonds, of a 0.3 carat size, where synthesized under a pressure of 5.5 GPa and at a temperature of 1350° C., employing the temperature gradient method and

TABLE 2

| Experiment No. | 6 Example | 7 Example | 8 Example | 9 Comparison | 10 Comparison | 11 Comparison |
| --- | --- | --- | --- | --- | --- | --- |
| Using a method with the plane perpendicular to the wire drawing hole | Cleavage | Cleavage | Cleavage | Polished | Polished | Polished |
| Angle between the wire drawing hole and the (111) face or polished face | 87° | 90.5° | 89° | 94° | 95.5° | 85° |
| Weight of copper wire passing through the die ($k_2$) | 280 | 360 | 330 | 130 | 110 | 100 |

Fe—50 Ni as the solvent metal. Three wire drawing dies, measuring 1.4 mm×1.4 mm×1.1 nm, and having 30 μm diameter wire drawing holes, were obtained in the same manner as in Example 1. The 1.4 mm×1.4 mm surfaces were formed by cleavage. The wire drawing hole is formed directing to the thickness of the wire drawing die.

The other three diamonds were polished into plates of 1.1 mm thickness. Then, the diamonds were worked into wire drawing dies which had a 30 μm diameter wire drawing hole and a size of 1.4 mm×1.4 mm×1.1 mm, using the same process as Example 1. The wire drawing holes were perpendicular to the 1.4 mm×1.4 mm surfaces. The concentration of nitrogen in each diamond was between 80 to 100 ppm. This concentration was estimated from the infra-red Table 2 shows that: 1) the wire drawing dies having a cleavage plane as (111) faces is preferable to having a polished plane; 2) the wire drawing dies having an angle between 87°–90° were preferred embodiments; and 3) the angle between 89° and 90° were the best embodiments.

EXAMPLE 3

A single crystal diamond of 0.8 carat size was synthesized under a pressure of 5.5 GPa and at a temperature of 1350° C., employing the temperature gradient method and Fe—50 Ni as the solvent metal. The single crystal diamond was cleaved into two plates of a 0.6 mm thickness. Two wire drawing dies were made from each plate in the same manner as in Example 1. The sizes were 1 mm×mm×0.6 mm. The diameter of drawing wire was 30 μm.

In addition, two natural diamonds were purchased, and cleaved using a diamond face which seemed to be similar to a (111) face. Two plates having a 0.6 mm thickness were obtained. Next, two wire drawing dies were made in the same manner as in Example 1. The sizes of the dies were 1 mm×mm ×0.6 mm. The concentration of nitrogen in the synthetic diamond was 90 ppm. The concentrations of nitrogen in the natural diamonds were 1250 ppm and 2000 ppm.

TABLE 3

| Experiment No. | 12 Example | 13 Example | 14 Comparison | 15 Comparison |
| --- | --- | --- | --- | --- |
| State of the cleavage plane | Even | Even | Spiral Steps | Other (111) faces faces appearing |
| Height of the step (μm) | 20 | 100 | 150 | 150 |
| Number of steps having 30–100 μm height | 0 | 3 | 5 | 4 |
| Kind of diamond | Synthesized Ib | Synthesized Ib | Natural Ib | Natural Ib |

The wire drawing dies which had a step height below 100 μm had an advantage over the others.

EXAMPLE 4

Five single crystal diamonds of 0.5–0.6 carat size, were synthesized under a pressure of 5.3 GPa and at a temperature of 1300° C. employing Fe—30 Ni as the solvent metal. The concentration of nitrogen was between 40–500 ppm. Five drawing dies of 2 mm×2 mm×1.5 mm were made in the same manner as in Example 1. In one of them, all the sides cut by laser were polished. The sides of the other four diamonds were cut using various laser beam conditions to provide various surface roughness. Next, one side of each drawing die that was cut by a laser beam was polished. The polished surfaces were the (110) faces and (112) faces. These wire drawing dies were fixed to the holder, and wire drawing testing was carried out. The results are shown below in Table 4.

TABLE 4

| Experiment No. | 16 Comparison | 17 Example | 18 Example | 19 Example | 20 Comparison |
| --- | --- | --- | --- | --- | --- |
| Method of working the side | Polished after laser cutting | Laser cutting | Laser cutting | Laser cutting | Laser cutting |
| Surface roughness of the side (μm) | 1 | 5 | 20 | 100 | 150 |
| Holding pressure (kg/mm$^2$) | 60 | 30 | 20 | 20 | 20 |
| Weight of copper wire passing through the die (kg) | 30 | 240 | 310 | 270 | 50 |
| Cause of tool life decrease | Cracking | Enlarged diameter | Enlarged diameter | Enlarged diameter | Cracking |

Table 4 shows that the diamonds whose surface texture was between 5 and 100 μm provided better results.

EXAMPLE 5

Seventy natural diamonds, which were of a 1.0–1.1 carat size, an octahedron-like roundness, and which did not contain impurities (except for trace amounts of nitrogen), were divided into seven sets of 10 natural diamonds. Ten synthetic diamonds, which were also of a 1.0 1.1 carat size, hexa-octahedron shape (as in FIG. 4 (a)), and which did not contain impurities (except for trace amounts of nitrogen), were also prepared. These eighty diamonds were provided for the following cutting tests summarized in Table 5. All the diamonds were cut in two using the four prior art methods and the four methods of our present invention. The ratio of those suffering no destruction upon cleavage is shown below in Table 5.

The four prior art methods

Experiment No. 21

Cutting by Blade

A disk of 0.15 mm thickness and made of phosphor bronze was inserted in the cutting machine and a kneaded mixture of about 10 μm diamond powder with machine oil was rubbed on the circumference of the blade. The blade rotated at 8,000 r.p.m. Next, the blade was ground on the surface of a natural diamond, and the diamond was cut. Marks of the blade were revealed on the cut surface, which had a curve of more than 0.1 mm.

Experimental No. 22

Cutting by Laser-Beam

A natural diamond was set on an X-Y table, and then cut by a YAG laser beam of 20 watts, moving the table in a prescribed direction. There were many vertical stripes on the cut side due to the pulse laser. Furthermore, the cut side had an inclination of 2°–6° to the laser beam, and was not parallel to the vertical direction of the table. The inclination around the inlet portion of the laser beam differed from the inclination around the outlet portion. Therefore, the cut side was curved.

Experiment No. 23

Cleavage After Being Flawed by a Diamond

After flawing a surface of natural diamond using another sharpened diamond, a steel wedge, which had a lead angle of 20° was wedged into the flaw by a hammer As a result, a great many of the natural diamonds were destroyed, with the yield was as low as 30%. In addition, the faces formed in the cleavage planes of diamonds which were destroyed were curved and shaped like a shell.

Experiment No. 24

After grooving the natural diamond employing the blade used in Experiment No. 21, the diamond was cleaved by the same method as Experiment No. 23. The faces formed by such cleavage were rather improved over those formed in Experiment No. 23.

The four methods of this invention

Experiment No. 25

The natural diamond was set on the X-Y table with the (111) faces parallel to the Y axis. A surface of the natural diamond was grooved by a YAG laser beam of 5 watts and the X-Y table moved toward the Y axis. The groove had a 0.08 mm width at the inlet of the laser beam, a 0.3 mm depth and a V-shape. A steel wedge having a lead angle of 20° was wedged into the groove by a hammer and the natural diamond was cleaved.

The face formed in the cleavage plane was more flat than the face obtained by Experiment Nos. 23 and 24.

Experiment No. 26

The natural diamond was set on a X-Y table in the same manner as in Experiment No. 25, with the table set in a vacuum chamber with the pressure lowered to $10^{-4}$ torr. An electron beam grooved the surface of the natural diamond, and the groove had a 0.1 mm width at the inlet of the laser beam, a 0.25 mm depth and a V-shape. Furthermore, the natural diamond was cleaved in the same way as in Experiment No. 25.

Experiment No. 27

An Ar ion beam was substituted for the electron beam used in Experiment No. 26. Otherwise, the process steps were the same as in Experiment No. 26.

Experiment No. 28

A synthetic diamond of a 1.0 carat size having a hexa-octahedron shape was used instead of a natural diamond, following the process steps of Experiment No. 25.

TABLE 5

| Experiment No. | | Method of dividing | Kind of diamond | Grooving method or cutting method | Mean surface flatness of the divided plane (mm) | Mean cutting width (mm) | Time of one division (min) | Yield (%) | Number of cut diamonds |
|---|---|---|---|---|---|---|---|---|---|
| Comparison | 21 | Cutting | Natural | (Blade) | 0.15 | 0.21 | 45 | 100 | 10 |
| | 22 | Cutting | Natural | (Laser beam) | 0.11 | 0.29 | 18 | 100 | 10 |
| | 23 | Cleavage | Natural | Diamond | 0.58 | 0 | 12 | 30 | 10 |
| | 24 | Cleavage | Natural | Blade | 0.31 | 0 | 8 | 50 | 10 |
| Example | 25 | Cleavage | Natural | Laser beam | 0.045 | 0 | 1.2 | 100 | 10 |
| | 26 | Cleavage | Natural | Electron beam | 0.070 | 0 | 10.5 | 100 | 10 |
| | 27 | Cleavage | Natural | Ion beam | 0.081 | 0 | 13.0 | 100 | 10 |
| | 28 | Cleavage | Natural | Laser beam | 0.012 | 0 | 0.3 | 100 | 10 |

EXAMPLE 6

Employing the same method as in Example 5, sets of ten (10) diamonds of 1.0–1.1. carat size were divided into 0.5 mm thick plates. The results are shown in Table 6.

Experiment No. 31 in Table 6 shows that a plate of a 0.5 mm thickness could not be obtained using the process of Experiment No. 23.

All of the dividing conditions were the same as in Experiment 5.

The plates manufactured by the previously described method were made into the following products:

1) Wire drawing dies

The plates were cut by laser into rectangular shapes. Then, the rectangular pieces, to be made into wire drawing dies, were holed and polished.

2) Dressers

The plates were cut by laser into stick-like shapes. Then, several pieces were mounted into steel shanks and finished as dressers.

3) Heatsinks

The top and bottom faces of the plates were polished and cut by laser into rectangular shapes. The surfaces were metalized, and the heatsinks were finished. All products were produced at a lower cost than previous methods allowed. Furthermore, the wire drawing dies and dressers demonstrated high and stable performance in abrasive tests.

TABLE 6

| Experiment No. | | Method of dividing | Kind of diamond | Grooving method or cutting method | Mean surface flatness of the divided plane (mm) | Mean cutting width (mm) | Time of one division (min) | Yield (%) | Number of cut diamonds |
|---|---|---|---|---|---|---|---|---|---|
| Comparison | 29 | Cutting | Natural | (Blade) | 0.19 | 0.20 | 45 | 77 | 57 |
| | 30 | Cutting | Natural | (Laser beam) | 0.10 | 0.25 | 18 | 95 | 68 |
| | 31 | Cleavage | Natural | Diamond | — | — | 12 | 0 | 0 |
| | 32 | Cleavage | Natural | Blade | 0.28 | 0 | 8 | 11 | 13 |
| Example | 33 | Cleavage | Natural | Laser beam | 0.048 | 0 | 1.2 | 91 | 89 |
| | 34 | Cleavage | Natural | Electron beam | 0.091 | 0 | 10.5 | 83 | 73 |
| | 35 | Cleavage | Natural | Ion beam | 0.080 | 0 | 13.0 | 84 | 76 |
| | 36 | Cleavage | Natural | Laser beam | 0.013 | 0 | 0.3 | 98 | 110 |

What is claimed is:

1. A wire drawing die comprising a Ib type synthetic single crystal diamond containing 20 ppm–400 ppm nitrogen, said diamond comprising at least two (111) faces, and a wire drawing hole whose center line forms an angle with the two (111) faces ranging 87°–93°.

2. The wire drawing die according to claim 1, wherein the angle is 89° to 91°.

3. The wire drawing die according to claim 1, wherein the drawing die is a hexahedron.

4. The wire drawing die according to claim 1, wherein the surface roughness of the (111) faces is at most 100 μm.

5. The wire drawing die according to claim 1, wherein at least one side of the drawing die has a surface roughness of 5–100 μm.

* * * * *